United States Patent
Grasset et al.

(10) Patent No.: US 6,552,586 B2
(45) Date of Patent: Apr. 22, 2003

(54) BIASING OF A MIXER

(75) Inventors: Jean-Charles Grasset, Moirans (FR); Philippe Cathelin, Laval (FR); Kuno Lenz, Voreppe (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/965,618

(22) Filed: Sep. 26, 2001

(65) Prior Publication Data
US 2002/0047735 A1 Apr. 25, 2002

(30) Foreign Application Priority Data
Sep. 26, 2000 (FR) .............................. 00 12221

(51) Int. Cl.$^7$ .............................................. H03B 19/00
(52) U.S. Cl. ..................................... 327/116; 327/113
(58) Field of Search ................................ 327/113, 116, 327/119–123, 355, 356, 359; 455/323, 326, 333

(56) References Cited

U.S. PATENT DOCUMENTS

| | | | | |
|---|---|---|---|---|
| 5,379,457 A | * | 1/1995 | Nguyen .................... | 327/113 |
| 5,774,002 A | * | 6/1998 | Guo et al. .................... | 327/113 |
| 5,886,547 A | * | 3/1999 | Durec et al. ................. | 327/113 |
| 6,205,325 B1 | * | 3/2001 | Groe .......................... | 455/118 |
| 6,219,536 B1 | * | 4/2001 | Kamase ...................... | 455/333 |
| 6,393,260 B1 | * | 5/2002 | Murtojarvi et al. .......... | 455/333 |

FOREIGN PATENT DOCUMENTS

| | | |
|---|---|---|
| EP | 0917285 A1 | 5/1999 |
| EP | 0942526 A1 | 9/1999 |
| EP | 0951138 A1 | 10/1999 |

* cited by examiner

*Primary Examiner*—Terry D. Cunningham
*Assistant Examiner*—Long Nguyen
(74) *Attorney, Agent, or Firm*—Lisa K. Jorgenson; Harold H. Bennett, II; Seed IP Law Group PLLC

(57) ABSTRACT

A mixer including a stage for inputting a voltage signal to be shifted and a shift and output stage for providing frequency-shifted signals, a biasing network of the output stage including, between a high supply and a biasing node, a constant current source in parallel with an output element of a current mirror, an input element of which receives a bias order from the input stage.

12 Claims, 2 Drawing Sheets

BIASING OF A MIXER

BACKGROUND OF THE INVENTION

1. Field of the Invention

The present invention relates to the biasing of a mixer. More specifically, the present invention relates to the biasing of switches of a mixer having a variable quiescent current.

2. Description of the Related Art

FIG. 1 illustrates the simplified diagram of a mixer intended for shifting the frequency of an oscillating voltage signal IF. The mixer receives signal IF in a first stage or input stage 10. Input stage 10 has a transconductance function. It converts input voltage signal IF into a current signal IF' and enables setting the quiescent current of the mixer. Current signal IF' is provided by input stage 10 to a second stage 20.

Second stage 20 is a frequency shift stage or switch stage. It has the function of mixing, that is, of multiplying, current signal IF' by a shift order LO. Shift order LO is a periodic voltage signal. Output signal RF has a frequency which is shifted with respect to input signal IF having the frequency of order LO.

For example, in telecommunication applications, and more specifically in the transmit portion of a mobile phone, signal IF is a signal having a frequency on the order of 200 MHz while shift order LO is a signal having a frequency on the order of 2 GHz. Output signal RF is for example the signal transmitted by a mobile handset to a fixed station.

It is further considered that, in the type of mixer shown in FIG. 1, the quiescent current is negligible. To modify the quiescent current of the mixer then enables modifying its gain, its linearity, and its electric consumption.

FIG. 2 illustrates the conventional forming of a mixer of the type previously described in relation with FIG. 1.

Input stage 10 includes an NPN bipolar transistor T1. Input signal IF is applied to the base of transistor T1 via a capacitor CF. The collector of transistor T1 provides output stage 20 with current signal IF' (output signal of input stage 10). The biasing of transistor T1 is ensured by the connection of the base of transistor T1 to a block formed of a current source 11 and of a comparator 12, the operation of which is described hereafter. The emitter of transistor T1 is connected to a reference low supply rail (ground) via a resistor RE. The current control is made possible by a feedback loop including a comparator 12. The output of comparator 12 is connected to the control terminal of current source 11. An inverting input (−) of comparator 12 is connected to a terminal of a voltage source (VG) 13. The second terminal of voltage source 13 is connected to the circuit ground. The non-inverting input (+) of comparator 12 is connected to the emitter of transistor T1. Current source 11 typically is a P-channel MOS transistor P1. The source and the substrate of transistor P1 are connected to a high supply rail Vdd of the circuit. The drain of transistor P1 forms the output of current source 11 and is connected to the base of transistor T1. The gate of transistor P1 forms the control terminal of source 11 and is connected to the output of comparator 12. Then, the current of the mixer is determined by the copying of value VG of current source 13 across resistor RE. The value of this current thus is iE=(VG/RE). The value of voltage VG is determined by a control circuit not shown. For example, in mobile telephony applications, the choice of value VG depends on the level of the RF signal received by a fixed station (not shown).

Output stage 20 is a differential stage including a pair of NPN-type bipolar transistors, TN and TP. Transistors TN and TP will be placed close to each other to exhibit similar operating characteristics. The emitters of transistors TN and TP receive output signal IF' of input stage 10. The emitters of transistors TN and TP are interconnected to the collector of transistor T1. A first shift order LON is sent to the base of transistor TN via a capacitor CN. A second shift order LOP, corresponding to first order LON with a 180° phase shift, is sent to the base of transistor TP via a capacitor CP. The collectors of transistors TN and TP form the outputs of stage 20 and provide differential current signals RFN and RFP.

Transistors TN and TP are biased by the connection to a same biasing node 14 via respective biasing resistors RN and RP of same value. The value of the voltage at biasing node 14 is determined by a biasing network 15. Network 15 is formed by the series connection, between high power supply Vdd and the ground, of a constant current source S, of a resistor R0 and of two diodes D1 and D2. Diodes D1 and D2 are connected to enable flowing of a current from source S to the ground. Node 14 is connected to the intermediary node between source S and resistor R0. Diodes D1 and D2 have the object of reproducing in biasing network 15 the base/emitter voltage drops of transistors T1 and TN (in parallel with identical transistor TP). Resistor R0 has the object of reproducing in biasing network 15 the voltage drops across biasing resistors RN and RP and across resistor RE.

A disadvantage of the mixer of FIG. 1 is the impossibility of precisely knowing and controlling the level of the D.C. biasing of the bases of transistors TN and TP of output stage 20. The biasing level, that is, the voltage on the bases of transistors TN and TP, will vary on the one hand from one circuit to another and, on the other hand, during operation. Indeed, the biasing level varies according to the current level and variations.

On the one hand, the required biasing currents vary from one circuit to another due to the variation of parameter β, that is, of the ratio between the current transmitted by a bipolar transistor and the control current, due to technological manufacturing dispersions. However, the three transistors TN, TP, and T1 of the circuit are formed simultaneously and substantially have the same parameter (that is, β=iE/iB=iEN/iN iEP/iP, with the notations of FIG. 2). Typically, parameter β varies by a factor four in a range from 50 to 200.

On the other hand, for a given circuit, the current varies during operation according to the value VG selected by source 13 of input stage 10.

Whatever the origin of the current variation, it affects biasing currents iN and iP of transistors TN and TP of output stage 20. This variation causes a current variation in network 15. This current variation then causes a variation of the voltage across resistor R0 and thus of the voltage at biasing node 14. This results in a possible saturation of one or the other of stages 10 or 20.

In practice, the biasing of stage 20 must be known and controlled with a great precision to guarantee, independently from current variations:

a sufficiently low biasing for the two transistors TN and TP of the differential pair of output stage 20 not to saturate; and a sufficiently high biasing to avoid saturation of transistor T1 of input stage 10 due to too low a collector/emitter voltage.

These problems are particularly enhanced and saturation phenomena are particularly frequent in the case of cells with a low supply Vdd, for example, on the order of 2.7 V.

In practice, the state of the art, to guarantee that transistor T1 of input stage 10 does not saturate, uses a current source S, the provided current of which has a high value. This value will be chosen according to the worst possible case in terms of current, that is, the case in which parameter β is very small while current iE (set by voltage VG) is maximum. For example for an emitter current iE of transistor T1 of input stage 10 having a value ranging between 1 and 5 mA, source S will have to provide a current (iEmax)/(βmin)=$5*10^{-3}$/ 50=100 μA. As previously discussed, this causes risks of saturation of output stage 20. For example, for a parameter β of average value and for a current iE having a value on the order of 1 mA, it would be enough for source S to provide a 10-μA current.

SUMMARY OF THE INVENTION

The present invention thus aims at providing a mixer having a controllable biasing.

The present invention aims at providing such a mixer, the biasing level of which remains steady during mixer operation.

The present invention also aims at providing such a mixer having a biasing level which is steady from one circuit to another, that is, whatever the parameter β of its transistors.

To achieve these objects, the present invention provides a mixer including a stage for inputting a voltage signal to be shifted and a shift and output stage for providing frequency-shifted signals, wherein a biasing network of the output stage includes, between a high supply and a biasing node, a constant current source in parallel with an output element of a current mirror, an input element of which receives a bias order from the input stage.

According to an embodiment of the present invention, the input and output elements of the current mirror of the biasing network of the output stage are P-type MOS transistors.

According to an embodiment of the present invention, the stage of input of the signal to be shifted is a stage with a variable quiescent current.

According to an embodiment of the present invention, the biasing network includes between the biasing node and a circuit ground the series connection of a resistor and of two diodes, the diodes being connected to enable flowing of a current from the biasing node to the circuit ground.

According to an embodiment of the present invention, the constant current source includes a circuit of bandgap type adapted to ensuring a constant voltage across the resistor of the biasing network.

According to an embodiment of the present invention, the high supply of the mixer is a low-voltage supply.

The foregoing objects, features and advantages of the present invention, will be discussed in detail in the following non-limiting description of specific embodiments in connection with the accompanying drawings.

DETAILED DESCRIPTION OF THE INVENTION

For clarity, same elements have been designated by the same references in the different drawings.

The present invention provides modifying the biasing of input and output stages 10 and 20 of a mixer as detailed hereafter.

Figure 3:
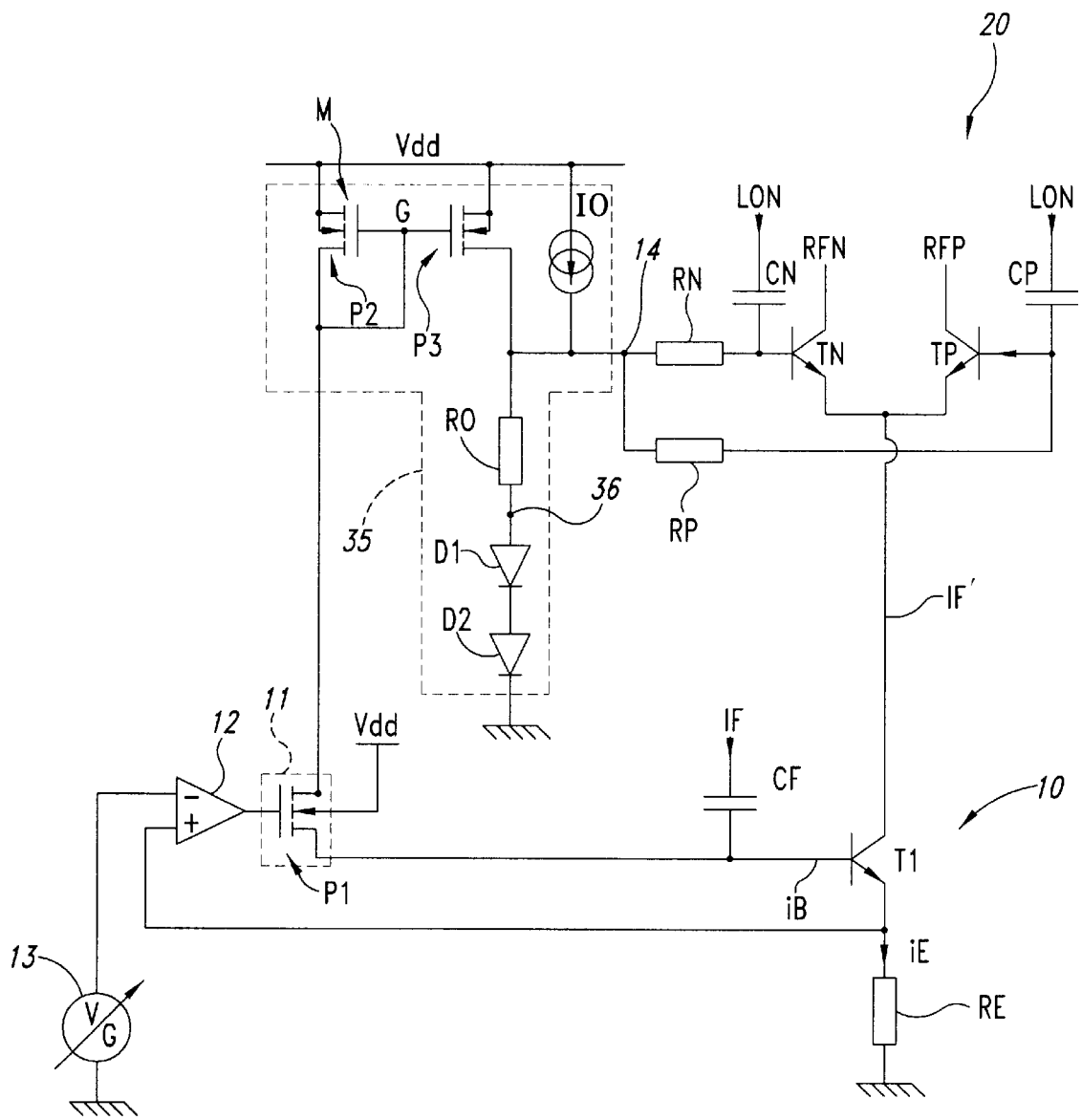
FIG. 3 illustrates an embodiment of a mixer according to the present invention.

In FIG. 3, biasing network 35 according to the present invention replaces constant current source S of prior art with the association of a current mirror M and of a constant current source I0 having a value much smaller than that of source S.

Current mirror M includes two P-type MOS transistors P2 and P3. The sources and substrate of transistors P2 and P3 are interconnected to high supply Vdd. A gate node G common to transistors P2 and P3 is connected to the drain of transistor P2. Node G is also connected to the source of transistor P1 of input stage 10. The drain of transistor P3 is connected to biasing node 14 of output stage 20. The substrate of transistor P1 is connected to high supply Vdd. The amplification ratio of mirror M between its input element P2 and its output element P3 is greater than one and will be designated hereafter as A.

Figure 1:
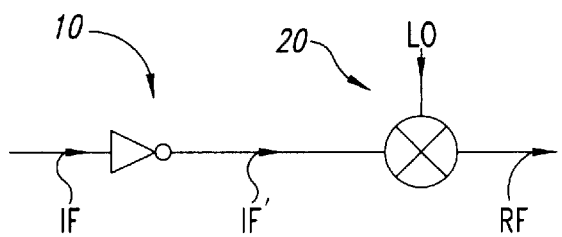
FIG. 1 schematically shows the type of mixer considered in the present description.
Figure 2:
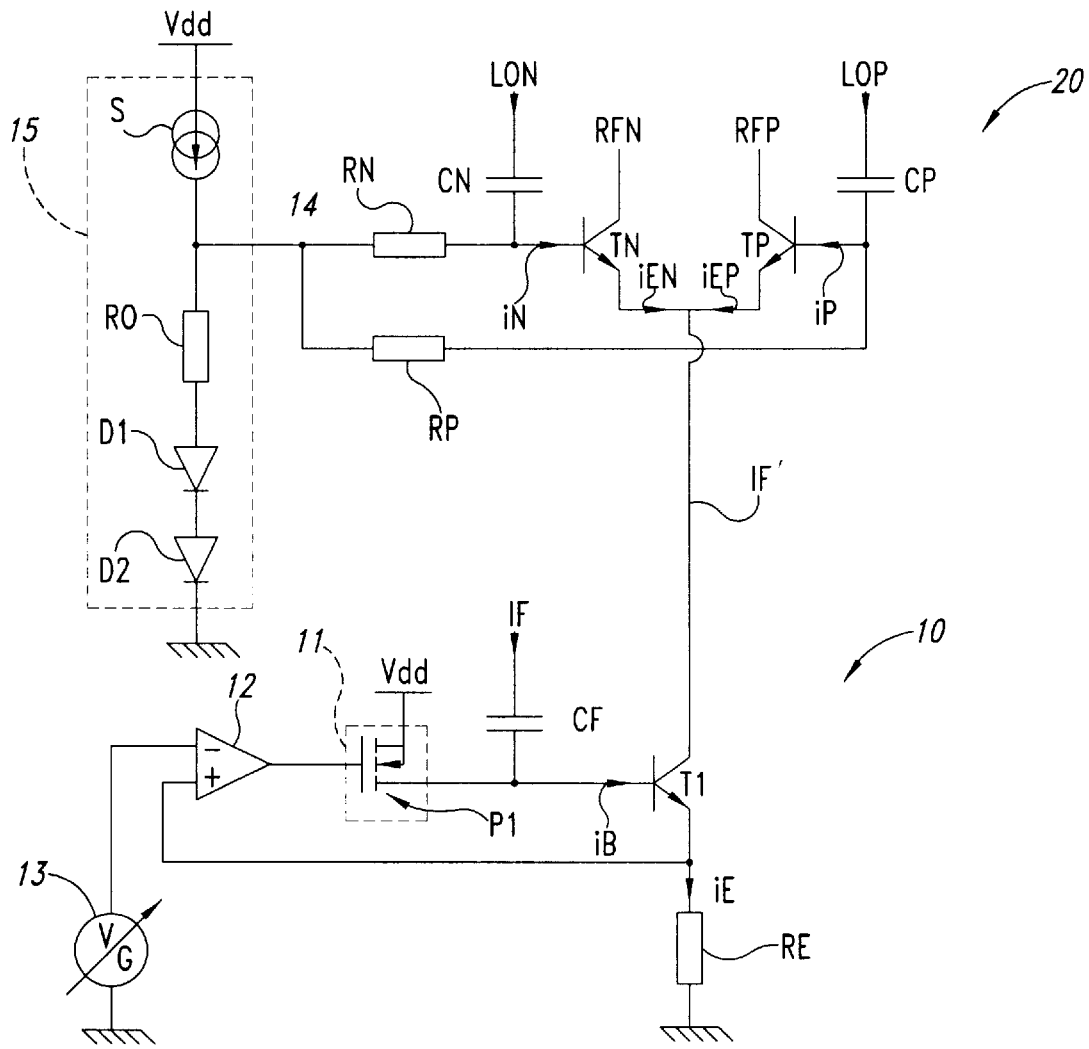
FIG. 2 schematically shows a conventional mixer.

The other circuit elements are connected as previously described in relation with FIG. 2.

Mirror M enables automatically indexing the biasing currents of output stage 20 without modifying the biasing level of the bases of transistors TN and TP. Mirror M is an asymmetrical mirror. Mirror M copies at node 14 the biasing current of bipolar transistor T1 of input stage 10 amplified by a given coefficient A greater than 1. With the notations of FIG. 3, voltage V on the bases of transistors TN and TP is the following:

$$V=VD+R0*(I0+(A-1)*iB)-RN*iB/2, \text{ or}$$

$$V=VD+R0*I0+(R0*(A-1)-RN/2)*iB;$$

where:

VD is the voltage across diodes D1 and D2 at node 36 of FIG. 3;

I0 is the current provided by constant current source I0 of block 35; and iB is the base current of transistor T1 of input stage 10.

As will be understood by those skilled in the art, to guarantee that the voltage on the bases of transistors TN and TP is independent from the variations of biasing current iB, amplification ratio A of mirror M must be such that R0*(A−1)=RN/2, or else A=+(RN/2R0). Thereby, the voltage on the bases of transistors TN and TP becomes:

$$V=VD+R0*I0.$$

Indeed, voltage V then no longer depends either on current control voltage VG or on the value of parameter β. The operating point of output stage 20 is stable.

Value I0 provided by current source I0 is chosen to obtain the desired bias voltage V on the bases of transistors TN and TP. R0*I0 takes into account the voltage drop across resistor RE of input stage 10 as well as a margin adapted to avoiding saturation of bipolar transistor T1 of input stage 10.

According to a specific embodiment, a current source I0 of bandgap type is used. Such a source provides a current proportional to the inverse of the value of a given resistance Rbg (I0=Vbg/Rbg, where Vbg is a constant). It is possible to form such a current source I0 from a given resistor Rbg, having a value proportional to the value of resistor R0, the proportionality coefficient α (Rbg=α*R0) being known and accurately controllable. Voltage V on the bases of transistors TN and TP of shift stage 20 then becomes V=VD+α*Vbg. This then ensures a biasing level V of transistors TN and TP which is perfectly defined, controllable and stable independently from possible variations of the value of resistance R0 due to uncontrollable fluctuations of the manufacturing process.

The presence of mirror M enables using a source I0 having a current depending on the sole biasing level desired on the bases of transistors TN and TP. The value of the current provided by source I0 will be on the order of a few tens of microamperes.

As a non-limiting example, the values of the different currents and components are the following:

current provided by source I0: 20 μA

RN=RP=1 kΩ;

RE=3 kΩ;

R0=5 kΩ;

A=1.1.

Of course, the present invention is likely to have various alterations, modifications, and improvements which will readily occur to those skilled in the art. In particular, the previously-indicated numerical examples are linked to a specific application. Those skilled in the art will know how to choose and adapt the values of the different components according to the specific operating conditions and to the desired performances.

Such alterations, modifications, and improvements are intended to be part of this disclosure, and are intended to be within the spirit and the scope of the present invention. Accordingly, the foregoing description is by way of example only and limited only as defined in the following claims and their equivalents. The present invention is limited thereto.

What is claimed is:

1. A mixer, comprising:

a stage for inputting a voltage signal to be shifted;

a shift and output stage for providing frequency-shifted signals;

a biasing network of the output stage, including, between a high supply and a biasing node, a constant current source in parallel with an output element of a current mirror; and an input element of the current mirror, configured to receive a bias order from the input stage.

2. The mixer of claim 1, wherein the input and output elements of the current mirror of the biasing network of the output stage are P-type MOS transistors.

3. The mixer of claim 1, wherein the input stage is a stage with a variable quiescent current.

4. The mixer of claim 1, wherein the biasing network includes, between the biasing node and a circuit ground, a series connection of a resistor and two diodes, the diodes being connected to enable flowing of a current from the biasing node to the circuit ground.

5. The mixer of the claim 1, wherein the constant current source includes a circuit of bandgap type adapted to ensuring a constant voltage across the resistor of the biasing network.

6. The mixer of claim 1, wherein the high supply of the mixer is a low-voltage supply.

7. A mixer, comprising:

an input stage, configured to receive an input signal;

an output stage, configured to shift the frequency of the input signal and to produce thereby an output signal; and a biasing network, configured to modify a biasing level of the output stage in response to a change in a bias level of the input stage; wherein the biasing network comprises a current mirror having an input element and an output element, and wherein the input element monitors the biasing level of the input stage and the output element provides the biasing level to the output stage.

8. The mixer of claim 7, wherein the biasing network maintains a direct relationship between the biasing level of the output stage and the biasing level of the input stage.

9. The mixer of claim 7, wherein the input and output elements of the current mirror are P-type MOS transistors.

10. The mixer of claim 7, wherein the input stage is a stage with a variable quiescent current.

11. The mixer of claim 7, wherein the biasing network includes a biasing node coupled to the output stage and, between the biasing node and a circuit ground, a series connection of a resistor and two diodes, the diodes being connected to enable flowing of a current from the biasing node to the circuit ground.

12. The mixer of the claim 11, wherein the biasing network includes a bandgap-type, constant current source structured to ensure a constant voltage across the resistor of the biasing network.

\* \* \* \* \*